(12) United States Patent
Wang et al.

(10) Patent No.: US 12,733,114 B2
(45) Date of Patent: Sep. 8, 2026

(54) DISPLAY APPARATUS

(71) Applicant: AUO Corporation, Hsinchu (TW)

(72) Inventors: Sheng-Chin Wang, Hsinchu (TW); Kuan-Hsun Chen, Hsinchu (TW)

(73) Assignee: AUO Corporation, Hsinchu (TW)

( * ) Notice: Subject to any disclaimer, the term of this patent is extended or adjusted under 35 U.S.C. 154(b) by 450 days.

(21) Appl. No.: 18/337,057

(22) Filed: Jun. 19, 2023

(65) Prior Publication Data

US 2024/0244769 A1 Jul. 18, 2024

(30) Foreign Application Priority Data

Jan. 18, 2023 (TW) ................................ 112102410

(51) Int. Cl.
*H05K 5/02* (2006.01)
*H05K 5/30* (2025.01)

(52) U.S. Cl.
CPC ................ *H05K 5/02* (2013.01); *H05K 5/30* (2025.01)

(58) Field of Classification Search
CPC .......... H05K 5/02; H05K 5/30; G09F 9/3026; G09F 9/33; G09F 9/335; G09F 9/302; G02F 1/1303; G02F 1/133311; G02F 1/133325; G02F 1/13336; G02F 2201/50; G02F 2202/28; G06F 1/1637; H10K 59/10
See application file for complete search history.

(56) References Cited

U.S. PATENT DOCUMENTS

2020/0292860 A1 9/2020 Chien et al.
2020/0301193 A1* 9/2020 Lee .................. G02F 1/133308

FOREIGN PATENT DOCUMENTS

| | | |
|---|---|---|
| CN | 104571654 | 4/2015 |
| CN | 104637878 | 5/2015 |
| CN | 109786269 | 5/2019 |
| CN | 112242352 | 1/2021 |
| KR | 20200113104 | 10/2020 |

* cited by examiner

*Primary Examiner* — Elmito Breval
(74) *Attorney, Agent, or Firm* — JCIPRNET

(57) ABSTRACT

A display apparatus includes a first display module including a substrate, an encapsulation layer, and a sealant. The substrate has a display surface, a bottom surface, and a side surface connected between the opposite display and bottom surfaces. The encapsulation layer is disposed on the display surface. The sealant includes a connection part, a bottom part contacting the bottom surface, and an extension part having an outer surface. The connection part has two opposite ends and opposite first and second surfaces. The bottom part and the extension part are respectively located at the two opposite ends and extended from the first and second surfaces in directions away from each other. The first surface contacts the side surface. The encapsulation layer contacts the connection part and the extension part and is coplanar with the outer surface. A horizontal distance between the outer surface and the second surface is greater than 0.

10 Claims, 2 Drawing Sheets

DISPLAY APPARATUS

CROSS-REFERENCE TO RELATED APPLICATION

This application claims the priority benefit of Taiwan application serial no. 112102410, filed on Jan. 18, 2023. The entirety of the above-mentioned patent application is hereby incorporated by reference herein and made a part of this specification.

BACKGROUND

Technical Field

The disclosure relates to an electronic apparatus; more particularly, the disclosure relates to a display apparatus.

Description of Related Art

Common display apparatuses include liquid crystal display apparatuses, organic light-emitting diode display apparatuses, and plasma display apparatuses, among others. The display apparatuses may be applied to various electronic products, such as televisions, desktop monitors, laptops, tablets, mobile phones, vehicle displays, and public displays. Moreover, to accommodate the sizes of these display apparatuses required by various electronic products, large-size display panels may be fabricated using existing components, and the resultant large-size display panels are then cut to form display modules of various required sizes.

However, in the process of forming the display modules of various required sizes, if a sealant has an excessive thickness, the straightness of the cut portion of the sealant may be poor; by contrast, if the sealant has an insufficient thickness, the protection capacity of the sealant on a substrate may be reduced.

SUMMARY

The disclosure relates to a display apparatus with a sealant capable of simultaneously protecting a substrate and ensuring straightness of a cut portion (i.e., an outer surface).

According to an embodiment of the disclosure, a display apparatus including a first display module, and the first display module includes a substrate, an encapsulation layer, and a sealant is provided. The substrate has a display surface, a bottom surface, and a side surface. The side surface is connected between the display surface and the bottom surface opposite to each other. The encapsulation layer is disposed on the display surface. The sealant includes a connection part, a bottom part, and an extension part. The connection part has two ends opposite to each other and a first surface and a second surface opposite to each other. The bottom part and the extension part are respectively located at the two opposite ends and are respectively extended from the first surface and the second surface in directions away from each other. The bottom part contacts the bottom surface. The first surface contacts the side surface. The extension part has an outer surface. The encapsulation layer contacts the connection part and the extension part and is coplanar with the outer surface, and a horizontal distance between the outer surface and the second surface is greater than 0.

In an embodiment of the disclosure, the display apparatus further includes a second display module spliced to the first display module, and the second display module includes a substrate, an encapsulation layer, and a sealant. The substrate has a display surface, a bottom surface, and a side surface. The side surface is connected between the display surface and the bottom surface opposite to each other. The encapsulation layer is disposed on the display surface. The sealant includes a connection part, a bottom part, and an extension part. The connection part has two ends opposite to each other and a first surface and a second surface opposite to each other. The bottom part and the extension part are respectively located at the two opposite ends and are respectively extended from the first surface and the second surface in directions away from each other. The bottom part contacts the bottom surface. The first surface contacts the side surface. The extension part has an outer surface. The encapsulation layer contacts the connection part and the extension part and is coplanar with the outer surface. A horizontal distance between the outer surface and the second surface is greater than 0.

In an embodiment of the disclosure, the outer surface of the first display module contacts the outer surface of the second display module.

In an embodiment of the disclosure, the first display module further includes an optical film that is disposed on one side of the encapsulation layer opposite to the substrate, and the optical film and the outer surface are coplanar.

In an embodiment of the disclosure, the optical film and the outer surface of the extension part have consecutive cut marks.

In an embodiment of the disclosure, a sum of a thickness of the extension part, a thickness of the encapsulation layer, and a thickness of the optical film is less than or equal to 450 micrometers.

In an embodiment of the disclosure, the extension part has a third surface and a fourth surface opposite to each other, the outer surface is connected between the third surface and the fourth surface, the third surface contacts the encapsulation layer, and a vertical distance between the fourth surface and the display surface is less than or equal to ½ times a thickness of the substrate.

In an embodiment of the disclosure, the extension part has a third surface and a fourth surface opposite to each other, the outer surface is connected between the third surface and the fourth surface, the third surface contacts the encapsulation layer, and the fourth surface has a plurality of grooves.

In an embodiment of the disclosure, a vertical distance between the bottom part and the bottom surface is greater than 0.

In an embodiment of the disclosure, the connection part and the extension part are collectively shaped as a letter L.

In light of the foregoing, in the display apparatus provided in one or more embodiments of the disclosure, the structural design of the sealant of the first display module allows the substrate to be protected by the connection part and the bottom part of the sealant, and through controlling the thickness of the extension part, the cut portion (i.e., the outer surface) of the extension part has good straightness, whereby a manufacturing yield and a protection capacity of the display apparatus may be effectively improved.

Moreover, the first display module of the display apparatus may further protect the substrate through the connection part and the bottom part of the sealant in a subsequent splicing process, so as to prevent the substrate of the first display module from directly colliding with substrates of other display modules (such as the substrate of the second display module), and through the outer surface of the extension part in contact with outer surfaces of other display modules (e.g., the outer surface of the second display module), the splicing process may be smoothly performed on the outer surface with good straightness, thus effectively improving the manufacturing yield and the protection capacity of the display apparatus.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
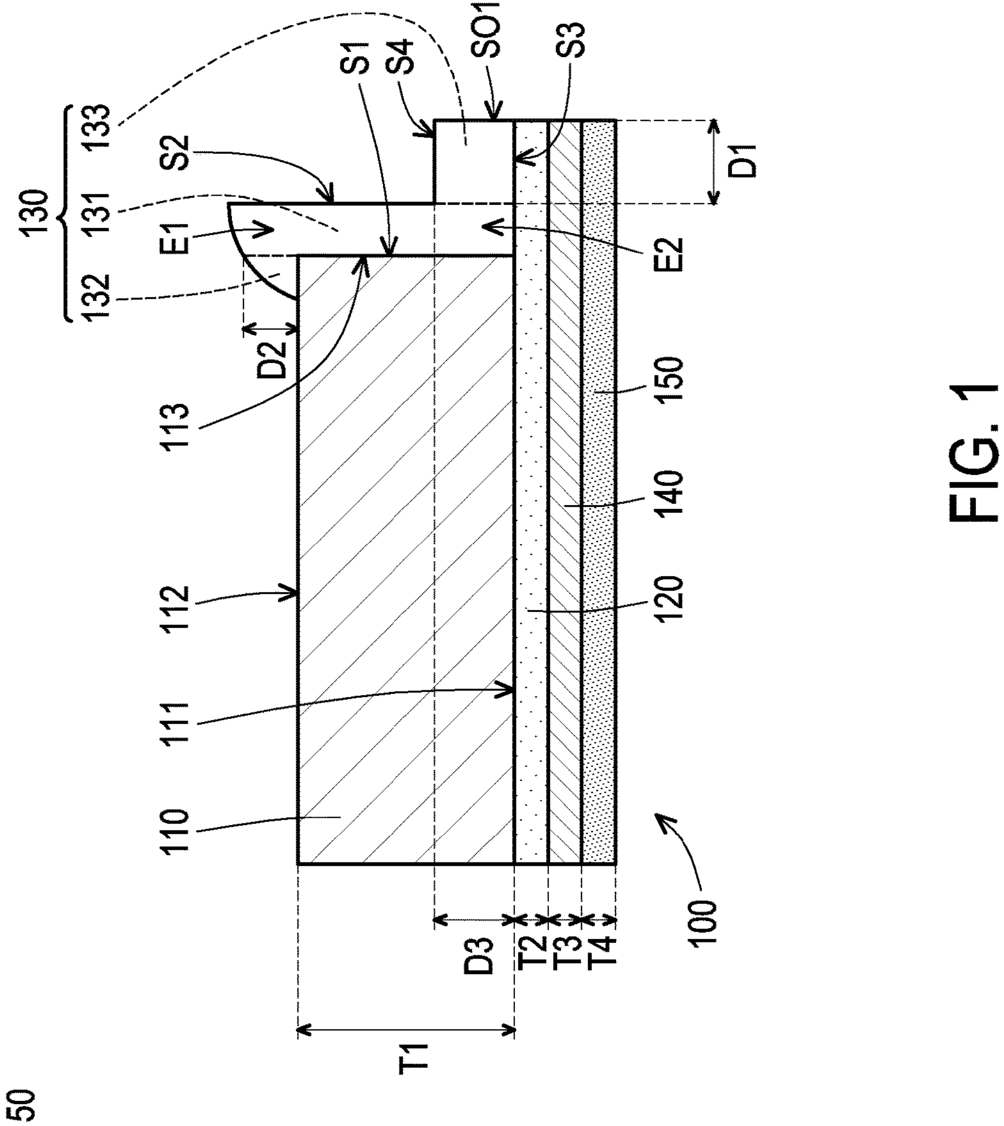
FIG. 1 is a schematic side view of a first display module of a display apparatus according to an embodiment of the disclosure.

Considering the particular amount of measurement and measurement-related errors discussed (i.e., the limitations of the measurement system), the terminology "about," "approximately," "essentially," or "substantially" used herein includes the average of the stated value and an acceptable range of deviations from the particular value as determined by those skilled in the art. For instance, the terminology "about" may refer to as being within one or more standard deviations of the stated value, or within ±30%, ±20%, ±15%, ±10%, or ±5%. Furthermore, the terminology "about," "approximately," "essentially," or "substantially" as used herein may be chosen from a range of acceptable deviations or standard deviations depending on the optical properties, etching properties, or other properties, rather than one standard deviation for all properties.

In the accompanying drawings, the thickness of layers, films, panels, regions, and so forth are enlarged for clarity. It should be understood that when an element, such as a layer, a film, a region, or a substrate is referred to as being "on" or "connected to" another element, it can be directly on or connected to the another element, or an intermediate element may also be present. By contrast, when an element is referred to as being "directly on" or "directly connected to" another element, no intermediate element is present. As used herein, being "connected" may refer to a physical and/or electrical connection. Furthermore, being "electrically connected" may refer to the presence of other elements between the two elements.

Furthermore, relative terminologies, such as "lower" or "bottom" and "upper" or "top" may be used herein to describe the relationship between one element and another element, as shown in the drawings. It should be understood that relative terminologies are intended to encompass different orientations of the device in addition to the orientation shown in the drawings. For instance, if a device in one of the accompanying drawings is turned upside down, elements described as being on the "lower" side of other elements would then be oriented on the "upper" sides of the other elements. Thus, the exemplary terminology "lower" may include an orientation of being on the "lower" side and the "upper" side, depending on the particular orientation of the accompanying drawings. Similarly, if the device in one of the accompanying drawings is turned upside down, elements described as being "below" or "beneath" other elements would then be oriented "above" the other elements. Thus, the exemplary terminology "below" or "beneath" may encompass an orientation of being above and below.

Reference will now be made in detail to the exemplary embodiments of the disclosure, examples of which are illustrated in the accompanying drawings. Whenever possible, the same reference numbers are used in the drawings and the description to refer to the same or like parts.

FIG. 1 is a schematic side view of a first display module of a display apparatus according to an embodiment of the disclosure. It should be noted that at the same time, right angle coordinates X-Y-Z are provided to better describe other components and for subsequent reference. Moreover, in the drawings, the proportional relationship of sizes and thicknesses of a substrate 110, an encapsulation layer 120, a sealant 130, an optical film 140, and a protection film 150 of a first display module 100 is merely schematic.

With reference to FIG. 1, a display apparatus 10 provided in this embodiment includes the first display module 100, and the first display module 100 includes the substrate 110, the encapsulation layer 120, and the sealant 130. For instance, the substrate 110 is a glass substrate, a material of the encapsulation layer 120 includes silicone, silicone resin, or epoxy resin, and the sealant 130 may be a light curing adhesive, a thermal curing adhesive, or a combination of the light curing adhesive and the thermal curing adhesive, which should however not be construed as a limitation in the disclosure.

Specifically, with reference to FIG. 1, in this embodiment, the substrate 110 has a display surface 111, a bottom surface 112, and a side surface 113. The side surface 113 is connected between the display surface 111 and the bottom surface 112 opposite to each other, and the encapsulation layer 120 is disposed on the display surface 111 of the substrate 110 in a Z-axis direction. The sealant 130 includes a connection part 131, a bottom part 132, and an extension part 133 which are connected to one another. The connection part 131 has two ends E1 and E2 opposite to each other in the Z-axis direction and a first surface S1 and a second surface S2 opposite to each other, and the bottom part 132 and the extension part 133 are respectively located at the two opposite ends E1 and E2 of the connection part 131 and are respectively extended from the first surface S1 and the second surface S2 of the connection part 131 in directions away from each other (i.e., respectively along a −Y-axis direction and +Y-axis direction).

In this embodiment, note that a plurality of light emitting devices (not shown) are, for instance, disposed on the display surface 111 of the substrate 110, and the light emitting devices (not shown) are, for instance, micro light emitting diodes (μLED), organic light emitting diodes (OLED), or laser diodes, which should however not be construed as a limitation in the disclosure.

More specifically, as shown in FIG. 1, in the present embodiment, the first surface S1 of the connection part 131 contacts the side surface 113 of the substrate 110, the bottom part 132 contacts the bottom surface 112 of the substrate 110, and the extension part 133 has an outer surface SO1. The encapsulation layer 120 contacts the connection part 131 and the extension part 133 in the Z-axis direction and is coplanar with the outer surface SO1 of the extension part 133, and a horizontal distance D1 between the outer surface SO1 of the extension part 133 and the second surface S2 of the connection part 131 in the Y-axis direction is greater than 0.

That is, in this embodiment, the first display module 100 may allow the connection part 131 to be connected to the substrate 110 and the encapsulation layer 120 through the sealant 130, and the connection to the encapsulation layer 120 may be enhanced through the extension part 133.

With reference to FIG. 1, in this embodiment, note that the connection part 131 and the extension part 133 are, for instance, collectively shaped as a letter L, so that the sealant 130 is able to protect the side surface 113 of the substrate 110 through the connection part 131 at the same time, and through controlling a thickness of the extension part 133, a cut portion (i.e., the outer surface SO1) of the extension part 133 may have good straightness, which should however not be construed as a limitation in the disclosure. In this embodiment, the connection part 131 and the bottom part 132 are collectively shaped as a reversed letter L, and a vertical distance D2 between the bottom part 132 and the bottom surface 112 of the substrate 110 in the Z-axis direction is greater than 0, for instance, so as to allow the sealant 130 to protect the bottom surface 112 of the substrate 110 through the bottom part 132, which should however not be construed as a limitation in the disclosure.

As mentioned above, the structural design of the sealant 130 allows the substrate 110 to be protected by the connection part 131 and the bottom part 132 of the sealant 130, and through controlling the thickness of the extension part 133, the cut portion (i.e., the outer surface SO1) of the extension part 133 has good straightness, whereby the manufacturing yield and the protection capacity of the first display module 100 in the display apparatus 10 are effectively improved.

The display apparatus 10 is further explained below.

With reference to FIG. 1, in this embodiment, the extension part 133 has a third surface S3 and a fourth surface S4 opposite to each other, and the outer surface SO1 is connected between the third surface S3 and the fourth surface S4. The third surface S3 contacts the encapsulation layer 120 in the Z-axis direction, and the fourth surface S4 has a plurality of grooves (not shown).

Specifically, as shown in FIG. 1, in this embodiment, a vertical distance D3 between the fourth surface S4 and the display surface 111 (i.e., the thickness of the extension part 133) is, for instance, less than or equal to ½ times the thickness T1 of the substrate 110, so as to ensure the cut portion (i.e., the outer surface) of the extension part 133 to have good straightness. For instance, the vertical distance D3 between the fourth surface S4 and the display surface 111 is, for instance, 300 micrometers, and the thickness T1 of the substrate 110 is, for instance, 700 micrometers, which should however not be construed as a limitation in the disclosure.

More specifically, with reference to FIG. 1, in this embodiment, the first display module 100 further includes the optical film 140 and the protection film 150. The optical film 140 is disposed on one side of the encapsulation layer 120 opposite to the substrate 110 in the Z-axis direction, and the optical film 140 is disposed between the encapsulation layer 120 and the protection film 150 in the Z-axis direction. The optical film 140 and the protection film 150 are coplanar with the outer surface SO1 of the extension part 133, and the optical film 140, the protection film 150, and the outer surface SO1 of the extension part 133 have consecutive cut marks.

That is, in this embodiment, the optical film 140 and the protection film 150 are cut together with the cut portion of the extension part 133 and are coplanar with the outer surface SO1 of the extension part 133, where the sum of the thickness of the extension part 133 (i.e., the vertical distance D3 between the fourth surface S4 and the display surface 111), a thickness T2 of the encapsulation layer 120, a thickness T3 of the optical film 140, and a thickness T4 of the protection film 150 is, for instance, less than or equal to 450 micrometers, so as to ensure the cut portion (i.e., the outer surface SO1) of the extension part 133 to have good straightness, which should however not be construed as a limitation in the disclosure.

According to this embodiment, note that the extension part 133 is formed, for instance, by applying a laser to etch and cut the sealant 130, where the extension part 133 may be repetitively irradiated once or multiple times by the laser, so that a plurality of grooves (not shown) are formed on the etched extension part 133, and then the extension part 133 with a reduced thickness after being etched may be cut by the laser, so as to ensure the cut portion (i.e., the outer surface SO1) to have good straightness; besides, the grooves (not shown), for instance, seem to be shaped as waves but are structures constituted by groove corners (i.e., structures constituted by non-right angles or chamfer-like structures), which should however not be construed as a limitation in the disclosure.

In this embodiment, since the substrate 110 is irradiated by the laser from the bottom surface 1120 to the display surface 111 (i.e., along the −Z axis direction), the grooves (not shown) are formed on the fourth surface S4 of the extension part 133 (i.e., a surface away from the display surface 111). Hence, when a user views a display image from the display surface 111 toward the bottom surface 112 (i.e., along a +Z-axis direction), the user does not see the grooves (not shown) on the fourth surface S4 located opposite to the display surface 111; as a result, the structure of the extension part 133 does not affect the user's viewing experience, and the aesthetic look of the display apparatus 10 may be guaranteed.

In addition, in this embodiment, the horizontal distance D1 between the outer surface SO1 of the extension part 133 and the second surface S2 of the connection part 131 in the Y-axis direction is, for instance, 25 micrometers, and is greater than a width of the laser applied to cut the extension part 133, so as to avoid the laser from causing damages to the connection part 131 while cutting the extension part 133, which should however not be construed as a limitation in the disclosure.

Figure 2:
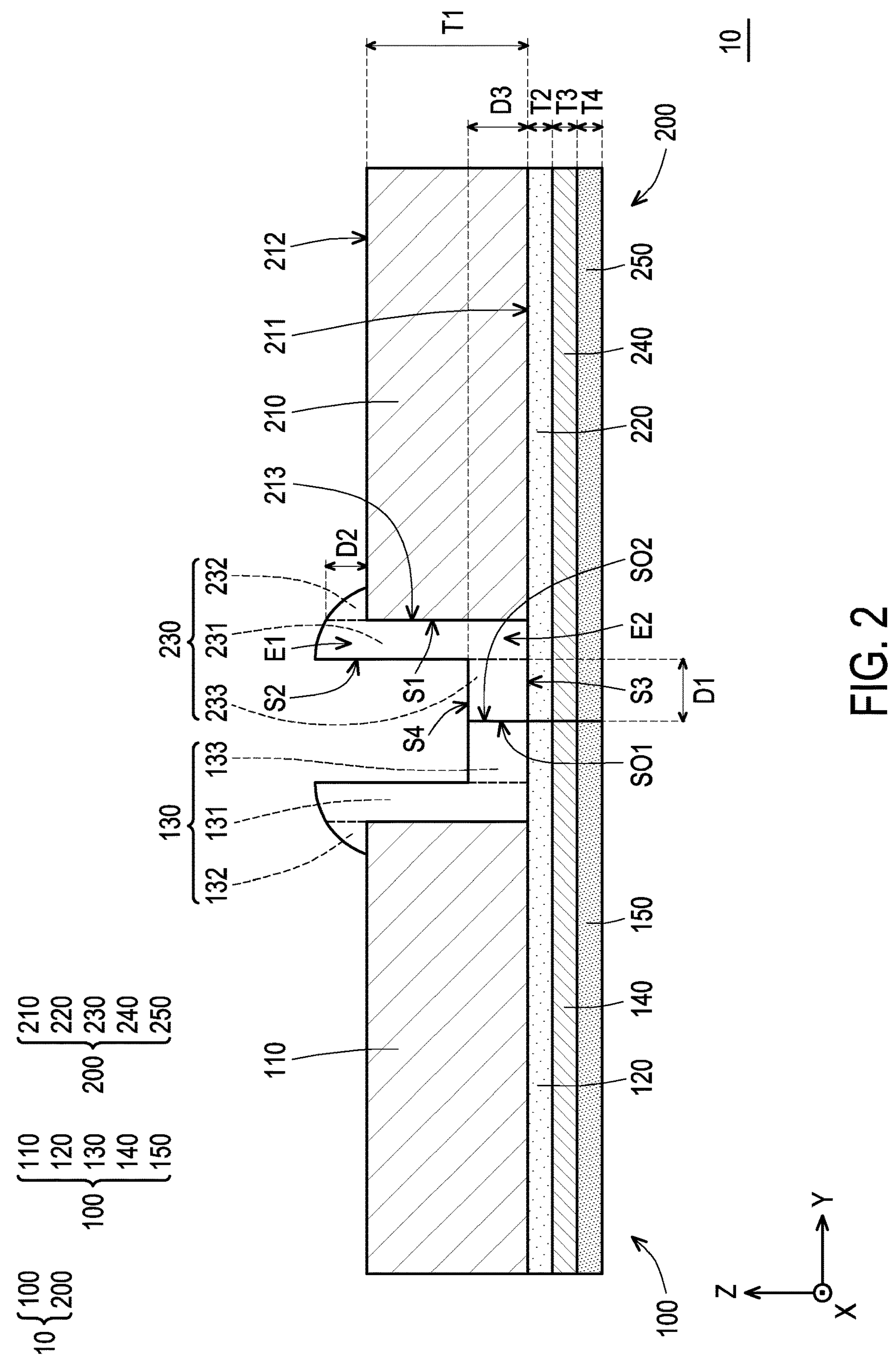
FIG. 2 is a schematic side view of the first display module and a second display module spliced together in the display apparatus depicted in FIG. 1.

FIG. 2 is a schematic side view of the first display module and a second display module spliced together in the display apparatus depicted in FIG. 1. It should be noted that the proportional relationship of sizes and thicknesses of a substrate 210, an encapsulation layer 220, a sealant 230, an optical film 240, and a protection film 250 in a second display module 200 in the drawings is merely schematic.

Besides, the second display module 200 and the first display module 100 have the same and symmetrical structure, and thus a structural design of the sealant 230 and technical effects resulting from the sealant 230 may be referred to as the corresponding design of the sealant 130 and the technical effects resulting from the sealant 130 in the first display module 100 and thus will not be further described hereinafter. In addition, the display apparatus 10 provided in the disclosure is not limited to the display apparatus where the display modules are spliced in some embodiments of the disclosure (that is, the first display module 100 and the second display module 200 that are spliced together are included). The display apparatus provided in other embodiments may include one single first display module 100 as shown in FIG. 1.

With reference to FIG. 2, in this embodiment, the display apparatus 10 further includes the second display module 200 spliced to the first display module 100, and the second display module 200 includes the substrate 210, the encapsulation layer 220, and the sealant 230. For instance, the substrate 210 is a glass substrate, a material of the encapsulation layer 120 includes silicone, silicone resin, or epoxy resin, and the sealant 130 may be a light curing adhesive, a thermal curing adhesive, or a combination of the light curing adhesive and the thermal curing adhesive, which should however not be construed as a limitation in the disclosure.

Specifically, with reference to FIG. 2, in this embodiment, the substrate 210 has a display surface 211, a bottom surface 212, and a side surface 213. The side surface 213 is connected between the display surface 211 and the bottom surface 212 opposite to each other, and the encapsulation layer 220 is disposed on the display surface 211 of the substrate 210 in the Z-axis direction. The sealant 230 includes a connection part 231, a bottom part 232, and an extension part 233 which are connected to one another. The connection part 231 has two ends E1 and E2 opposite to each other in the Z-axis direction and a first surface S1 and a second surface S2 opposite to each other, and the bottom part 232 and the extension part 233 are respectively located at the two opposite ends E1 and E2 of the connection part 231 and are respectively extended from the first surface S1 and the second surface S2 of the connection part 231 in directions away from each other (i.e., respectively along a +Y-axis direction and −Y-axis direction).

In this embodiment, note that a plurality of light emitting devices (not shown) are, for instance, disposed on the display surface 211 of the substrate 210, and the light emitting devices (not shown) are, for instance, μLED, OLED, or laser diodes, which should however not be construed as a limitation in the disclosure.

More specifically, as shown in FIG. 2, in the present embodiment, the first surface S1 of the connection part 231 contacts the side surface 213 of the substrate 210, the bottom part 232 contacts the bottom surface 212 of the substrate 210, and the extension part 233 has an outer surface SO2. The encapsulation layer 220 contacts the connection part 231 and the extension part 233 in the Z-axis direction and is coplanar with the outer surface SO2 of the extension part 233, and a horizontal distance D1 between the outer surface SO2 of the extension part 233 and the second surface S2 of the connection part 231 in the Y-axis direction is greater than 0.

That is, in this embodiment, the second display module 200 may allow the connection part 231 to be connected to the substrate 210 and the encapsulation layer 220 through the sealant 230, and the connection to the encapsulation layer 220 may be enhanced through the extension part 233.

With reference to FIG. 2, in this embodiment, note that the connection part 231 and the extension part 233 are, for instance, collectively shaped as a letter L, so that the sealant 230 is able to protect the side surface 213 of the substrate 210 through the connection part 231 at the same time, and through controlling a thickness of the extension part 233, a cut portion (i.e., the outer surface SO2) of the extension part 233 may have good straightness, which should however not be construed as a limitation in the disclosure. In this embodiment, the connection part 231 and the bottom part 232 are collectively shaped as a reversed letter L, and a vertical distance D2 between the bottom part 232 and the bottom surface 212 of the substrate 210 in the Z-axis direction is greater than 0, for instance, so as to allow the sealant 230 to protect the bottom surface 212 of the substrate 210 through the bottom part 232, which should however not be construed as a limitation in the disclosure.

More specifically, with reference to FIG. 2, in this embodiment, the second display module 200 further includes the optical film 240 and the protection film 250. The optical film 240 is disposed on one side of the encapsulation layer 220 opposite to the substrate 210 in the Z-axis direction, and the optical film 240 is disposed between the encapsulation layer 220 and the protection film 250 in the Z-axis direction. The optical film 240 and the protection film 250 are coplanar with the outer surface SO2 of the extension part 233, and the optical film 240, the protection film 250, and the outer surface SO2 of the extension part 233 have consecutive cut marks.

That is, in this embodiment, the optical film 240 and the protection film 250 are cut together with the cut portion of the extension part 233 and are coplanar with the outer surface SO2 of the extension part 233, where the sum of the thickness of the extension part 233 (i.e., the vertical distance D3 between the fourth surface S4 of the extension part 233 and the display surface 111), a thickness T2 of the encapsulation layer 220, a thickness T3 of the optical film 240, and a thickness T4 of the protection film 250 is, for instance, less than or equal to 450 micrometers, so as to ensure the cut portion (i.e., the outer surface SO2) of the extension part 233 to have good straightness, which should however not be construed as a limitation in the disclosure.

Thereby, the first display module 100 and the second display module 200 may be in contact each other through the outer surfaces SO1 and SO2, respectively and thus are able to be spliced together.

As such, the first display module 100 and the second display module 200 in the display module 10 may, through the respective structural design of the sealants 130 and 230, allow the substrates 110 and 210 to be respectively protected by the connection parts 131 and 231 and the bottom parts 132 and 232 of the sealants 130 and 230, and through controlling the thicknesses of the extension parts 133 and 233, the cut portions (i.e., the outer surfaces SO1 and SO2) of the extension parts 133 and 233 may have good straightness. Accordingly, when the first display module 100 and the second display module 200 are spliced together, the substrate 110 of the first display module 100 may be effectively prevented from directly colliding with the substrate 210 of the second display module 210, and the splicing process may be smoothly performed on the outer surfaces SO1 and SO2 with good straightness, thus effectively improving the manufacturing yield and the protection capacity of the display apparatus 10.

To sum up, in the display apparatus provided in one or more embodiments of the disclosure, through the structural design of the sealant, the first display module allows the substrate to be protected by the connection part and the bottom part of the sealant, and by controlling the thickness of the extension part, the cut portion (i.e., the outer surface) of the extension part may have good straightness, thereby effectively improving the manufacturing yield and the protection capacity of the display apparatus.

Moreover, the first display module in the display apparatus may also protect the substrate through the connection part and the bottom part of the sealant in the subsequent splicing process, so as to avoid the substrate of the first display module from directly colliding with the substrates of other display modules (such as the substrate of the second display module), and through the outer surface of the extension part in contact with the outer surfaces of other display modules (e.g., the outer surface of the second display module), the splicing process may be smoothly performed on the outer surface with good straightness, thus effectively improving the manufacturing yield and the protection capacity of the display apparatus.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display apparatus, comprising:

a first display module, comprising:

a substrate, having a display surface, a bottom surface, and a side surface, wherein the side surface is connected between the display surface and the bottom surface opposite to each other;

an encapsulation layer, disposed on the display surface, wherein the encapsulation layer contacts the display surface; and a sealant, comprising a connection part, a bottom part, and an extension part, wherein the connection part has two ends opposite to each other and a first surface and a second surface opposite to each other, the bottom part and the extension part are respectively located at the two opposite ends and are respectively extended from the first surface and the second surface in directions away from each other, the bottom part contacts the bottom surface, the first surface contacts the side surface, the extension part has an outer surface and overlaps the side surface along a normal direction of the side surface, the encapsulation layer contacts the connection part and the extension part and is coplanar with the outer surface, and a horizontal distance between the outer surface and the second surface is greater than 0.

2. The display apparatus according to claim 1, further comprising a second display module spliced to the first display module, the second display module comprising:

a substrate, having a display surface, a bottom surface, and a side surface, wherein the side surface is connected between the display surface and the bottom surface opposite to each other;

an encapsulation layer, disposed on the display surface of the substrate of the second display module; and a sealant, comprising a connection part, a bottom part, and an extension part, wherein the connection part has two ends opposite to each other and a first surface and a second surface opposite to each other, the bottom part and the extension part are respectively located at the two opposite ends and are respectively extended from the first surface and the second surface in directions away from each other, the bottom part contacts the bottom surface, the first surface contacts the side surface, the extension part has an outer surface, the encapsulation layer contacts the connection part and the extension part and is coplanar with the outer surface, and a horizontal distance between the outer surface and the second surface is greater than 0.

3. The display apparatus according to claim 2, wherein the outer surface of the first display module contacts the outer surface of the second display module.

4. The display apparatus according to claim 1, wherein the first display module further comprises an optical film, the optical film is disposed on one side of the encapsulation layer opposite to the substrate, and the optical film and the outer surface are coplanar.

5. The display apparatus according to claim 4, wherein the optical film and the outer surface of the extension part have consecutive cut marks.

6. The display apparatus according to claim 4, wherein a sum of a thickness of the extension part, a thickness of the encapsulation layer, and a thickness of the optical film is less than or equal to 450 micrometers.

7. The display apparatus according to claim 1, wherein the extension part has a third surface and a fourth surface opposite to each other, the outer surface is connected between the third surface and the fourth surface, the third surface contacts the encapsulation layer, and a vertical distance between the fourth surface and the display surface is less than or equal to ½ times a thickness of the substrate.

8. The display apparatus according to claim 1, wherein the extension part has a third surface and a fourth surface opposite to each other, the outer surface is connected between the third surface and the fourth surface, the third surface contacts the encapsulation layer, and the fourth surface has a plurality of grooves.

9. The display apparatus according to claim 1, wherein a vertical distance between the bottom part and the bottom surface is greater than 0.

10. The display apparatus according to claim 1, wherein the connection part and the extension part are collectively shaped as a letter L.

* * * * *